(12) United States Patent
Fogel et al.

(10) Patent No.: US 8,878,055 B2
(45) Date of Patent: Nov. 4, 2014

(54) EFFICIENT NANOSCALE SOLAR CELL AND FABRICATION METHOD

(75) Inventors: Keith E. Fogel, Hopewell Junction, NY (US); William S. Graham, Irvington, NY (US); Jeehwan Kim, Los Angeles, CA (US); Harold J. Hovel, Katonah, NY (US); Devendra K. Sadana, Pleasantville, NY (US); Katherine L. Saenger, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 267 days.

(21) Appl. No.: 12/852,991

(22) Filed: Aug. 9, 2010

(65) Prior Publication Data
US 2012/0031454 A1 Feb. 9, 2012

(51) Int. Cl.
H01L 31/00 (2006.01)
H01L 31/052 (2014.01)
H01L 31/0236 (2006.01)
H01L 31/0352 (2006.01)

(52) U.S. Cl.
CPC ...... H01L 31/0527 (2013.01); H01L 31/02366 (2013.01); H01L 31/03529 (2013.01); Y02E 10/52 (2013.01)
USPC ...................................................... 136/256

(58) Field of Classification Search
CPC .................... H01L 31/0236; H01L 31/02363; H01L 31/02366; H01L 31/03529; H01L 31/0527
USPC ................................. 136/255, 256
See application file for complete search history.

(56) References Cited

U.S. PATENT DOCUMENTS

| 5,159,171 A | 10/1992 | Cook et al. |
| 5,185,178 A | 2/1993 | Koskenmaki et al. |
| 5,366,140 A | 11/1994 | Koskenmaki et al. |
| 5,486,427 A | 1/1996 | Koskenmaki et al. |
| 5,593,901 A * | 1/1997 | Oswald et al. ............. 438/80 |
| 6,033,928 A | 3/2000 | Eriguchi et al. |
| 6,605,772 B2 | 8/2003 | Harman et al. |
| 7,227,066 B1 | 6/2007 | Roscheisen et al. |
| 7,589,880 B2 | 9/2009 | Kempa et al. |
| 7,634,162 B2 | 12/2009 | Kempa et al. |
| 2001/0015221 A1* | 8/2001 | Kubota et al. ............. 136/256 |

(Continued)

FOREIGN PATENT DOCUMENTS

| JP | 2005197537 A * | 7/2005 |
| WO | WO 2009082137 A2 * | 7/2009 |
| WO | 2011033464 A | 3/2011 |

OTHER PUBLICATIONS

Patent Cooperation Treaty. "Notification of Transmittal of the International Search Report and the Written Opinion of the International Searching Authority, or the Declaration" Issued for PCT/US2012/052759 on Nov. 13, 2012. (17 Pages).

Hsu, C., et al. "Wafer-Scale Silicon Nanopillars and Nanocones by Langmuir-Blodgett Assembly and Etching" Applied Physics Letter. vol. 93, Issue 13. Oct. 2008. (3 Pages).

(Continued)

*Primary Examiner* — Eli Mekhlin
(74) *Attorney, Agent, or Firm* — Tutunjian & Bitetto, P.C.; Louis J. Percello (57) ABSTRACT

A photovoltaic device and method include a substrate layer having a plurality of structures including peaks and troughs formed therein. A continuous photovoltaic stack is conformally formed over the substrate layer and extends over the peaks and troughs. The photovoltaic stack has a thickness of less than one micron and is configured to transduce incident radiation into current flow.

15 Claims, 7 Drawing Sheets

(56) References Cited

U.S. PATENT DOCUMENTS

| | | | |
|---|---|---|---|
| 2001/0037825 A1* | 11/2001 | Nakano et al. | 136/256 |
| 2002/0117661 A1* | 8/2002 | Kondo et al. | 257/21 |
| 2004/0149330 A1* | 8/2004 | Sugiyama et al. | 136/249 |
| 2007/0047056 A1 | 3/2007 | Kempa et al. | |
| 2007/0137697 A1 | 6/2007 | Kempa et al. | |
| 2007/0176288 A1 | 8/2007 | Daubenspeck et al. | |
| 2008/0265149 A1* | 10/2008 | Endoh et al. | 250/237 R |
| 2009/0194160 A1 | 8/2009 | Chin et al. | |
| 2009/0274873 A1 | 11/2009 | Shinotsuka | |
| 2009/0296189 A1 | 12/2009 | Black et al. | |
| 2010/0071760 A1* | 3/2010 | Kwok et al. | 136/256 |
| 2010/0240167 A1 | 9/2010 | Dasgupta et al. | |
| 2010/0258163 A1* | 10/2010 | Zheng et al. | 136/252 |
| 2010/0288329 A1* | 11/2010 | Hong et al. | 136/244 |
| 2010/0319758 A1 | 12/2010 | Ikuno | |
| 2011/0121431 A1 | 5/2011 | Cui et al. | |
| 2011/0272004 A1 | 11/2011 | Davis et al. | |
| 2011/0277827 A1 | 11/2011 | Yang et al. | |
| 2011/0284061 A1 | 11/2011 | Vanecek et al. | |
| 2012/0060905 A1 | 3/2012 | Fogel et al. | |

OTHER PUBLICATIONS

Hong, A., et al. (Formation of Metal Nanospheres and Microspheres) Final Office Action for U.S. Appl. No. 13/606,916 mailed on Jul. 17, 2013. (9 Pages).

Hong, A., et al. (Funiformly Distributed Self-Assembled Solder Dot Formation for High Efficiency Solar Cells) Non Final Office Action for U.S. Appl. No. 13/611,047 mailed on Jul. 29, 2013. (39 Pages).

Hong, A., et al. (Formation of Metal Nanospheres and Microspheres) Non Final Office Action for U.S. Appl. No. 13/220,816 mailed on Aug. 1, 2013. (11 Pages).

Fogel, K., et al. (Nanowires Formed by Employing Solder Nanodots) Non Final Office Action for U.S. Appl. No. 12/879,209 mailed on Aug. 27, 2013. (8 Pages).

Fogel, K., et al. (Nanowires Formed by Employing Solder Nanodots) Final Office Action issue in U.S. Appl. No. 13/599,577 on Sep. 20, 2013. (15 Pages).

Krzyzewski, T., et al. "Ripening and Annealing Effects in INAS/GAAS (001) Quantum Dot Formation" Journal of Applied Physics, vol. 96, No. 1. Jul. 2004. (8 Pages).

\* cited by examiner

EFFICIENT NANOSCALE SOLAR CELL AND FABRICATION METHOD

BACKGROUND

1. Technical Field

The present invention relates to photovoltaic devices, and more particularly to a device and method for fabricating a corrugated or undulating photovoltaic device structure with nanolayers to achieve higher efficiency.

2. Description of the Related Art

With growing concern about low cost clean energy, solar power has again become a focal point for alternatives to fossil fuel energy production. Solar energy, while clean and sustainable, typically relies on expensive technologies for its implementation. These technologies include the incorporation of integrated circuits or integrated circuit technology into the fabrication of solar cells. The expense associated with current solar panels is a strong disincentive from moving in the direction of solar power.

Solar panels employ photovoltaic cells to generate current flow. When a photon hits silicon, the photon may be transmitted through the silicon, reflected off the surface, or absorbed by the silicon if the photon energy is higher than the silicon band gap value. This generates an electron-hole pair and sometimes heat, depending on the band structure. To achieve good carrier collection efficiency, nanorods have been suggested. These structures extend from a base and have an increased absorption length due to the length of the nanorod (or wire). Nanorods require expensive processing techniques (patterning and etching steps in a clean room semiconductor processing environment) to form them.

SUMMARY

A photovoltaic device and method include a substrate layer having a plurality of structures including peaks and troughs formed therein. A continuous photovoltaic stack is conformally formed over the substrate layer and extends over the peaks and troughs. The photovoltaic stack has a thickness of less than one micron and is configured to transduce incident radiation into current flow.

Another photovoltaic device includes a substrate layer having a plurality of grooves formed therein across a major surface of the substrate layer. The grooves extend in at least one direction along the major surface. For example, grooves in two directions may form vertical cones or wires. A continuous photovoltaic stack is conformally formed over the substrate layer which extends into the grooves. The photovoltaic stack includes at least a P-type layer, an N-type layer and an intrinsic layer disposed therebetween. The photovoltaic stack is about 0.5 microns or less in depth and is configured to transduce incident radiation into current flow.

A method for forming a photovoltaic device includes mechanically forming a plurality of grooves in a substrate layer; and forming a continuous photovoltaic stack including an N-type layer, a P-type layer and an intrinsic layer therebetween which conforms to a surface of the substrate layer and into the plurality of grooves such that the continuous photovoltaic stack follows peaks and valleys in the substrate layer.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

In accordance with the present principles, devices and methods for fabricating these devices are provided. The devices employ a substrate layer having prefabricated structures configured to provide a vertical component of a radiation absorption layer. The vertical component may include a hill and trough structure having sides that carry the light absorbing material. The sides provide a depth to increase the likelihood of absorption of the radiation. In this way, the structures provide an inexpensive method that does not require expensive lithographic patterning of nanorods and results in higher absorption efficiency.

A hole-electron pair collection in amorphous silicon (a low lifetime material) takes place within 300~500 nm from its surface. Light, however, can penetrate further than this depth. Therefore, a vertical array of thin amorphous silicon cells (with depth<300 nm) with more than 1 micron height will absorb more light and provide horizontal carrier collection within the distance of less than 300 nm. To make an amorphous silicon pillar structure, however, a nano-templated mask and subsequent dry etching are needed. This may increase process cost and result in damage on the amorphous silicon surface.

In accordance with particularly useful embodiments, mechanical grooving, stamping, embossing etc. on a metal substrate or a glass substrate may be employed to form a three-dimensional (3D) nanostructure with conformal thin film solar cell depositions. These nanostructured solar cells will provide high efficiency with reduced cost. Deposition of conformal low carrier life time materials (e.g., amorphous silicon) with thin thicknesses on the 3D-structured substrate provides cost effective structures with low potential damage of the surface and provides better performance. When 3D structures are employed in thin film photovoltaic devices, the thickness needed for planar photovoltaic devices is not necessary. Especially for amorphous Si photovoltaics, the thinner the layer, the less light degradation there is.

It is to be understood that the present invention will be described in terms of given illustrative architectures for a solar cell; however, other architectures, structures, substrate materials and process features and steps may be varied within the scope of the present invention. A circuit formed using these structures as described herein may be part of a design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips and/or solar cells. The resulting integrated circuit chips or cells can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes photovoltaic devices, integrated circuit chips with solar cells, ranging from toys, calculators, solar collectors and other low-end applications to advanced products.

The flowchart and block diagrams in the Figures illustrate the architecture, functionality, and operation of possible implementations of systems, and methods according to various embodiments of the present invention. It should be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 1:
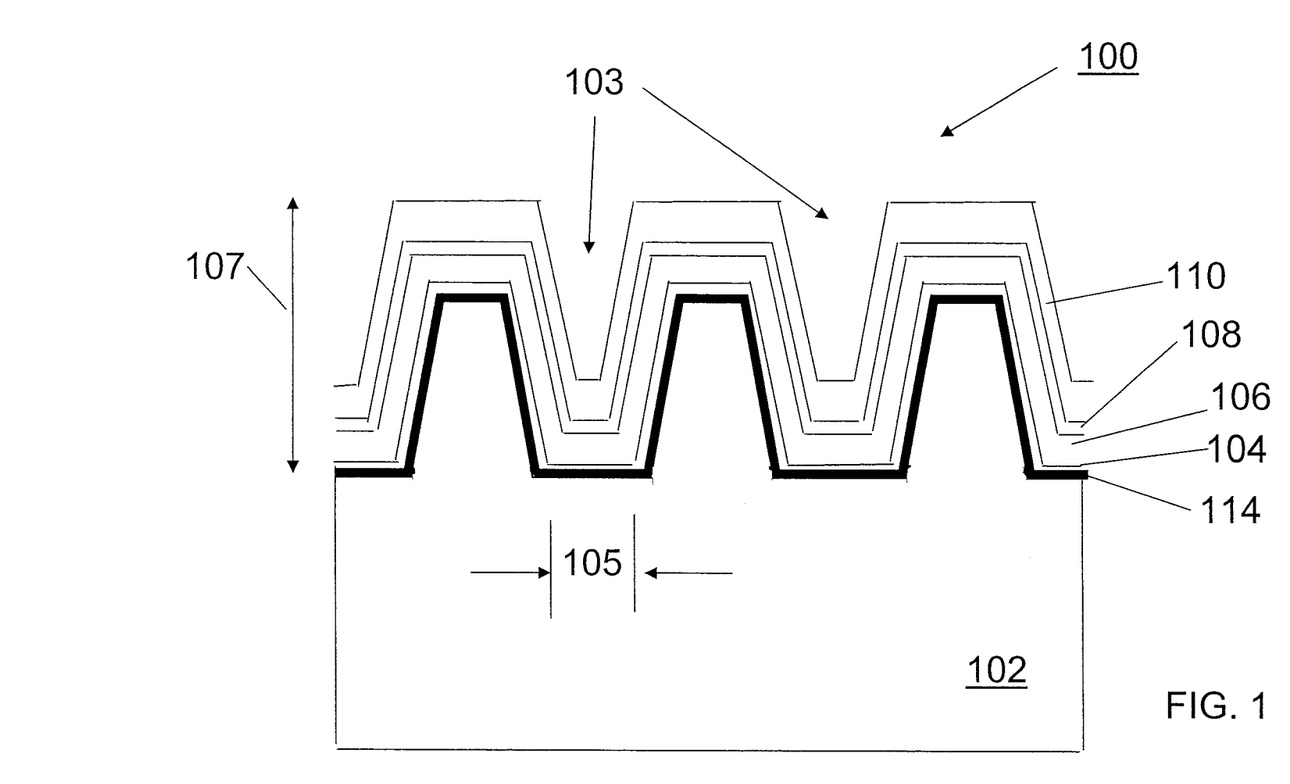
FIG. 1 is a cross-sectional view of a photovoltaic device having a plurality of grooves supporting a nanoscale junction on a metal substrate in accordance with one embodiment.

Referring now to the drawings in which like numerals represent the same or similar elements and initially to FIG. 1, an illustrative photovoltaic structure 100 is illustratively depicted in accordance with one embodiment. The photovoltaic structure 100 may be employed in solar cells, light sensors or other photovoltaic applications. Structure 100 includes a substrate layer 102 that is prefabricated with grooves 103, which may be mechanically or chemically applied. The substrate 102 may include a metal or other opaque material, such as aluminum, copper, etc.

The metal substrate layer 102 may be employed as a back-reflector or include a back reflector layer 114 formed on substrate layer 102. The back-reflector layer 114 may include a transparent oxide, such as, ZnO and a reflective surface. This layer may be deposited before forming a layer 104. A reflective surface may be provided on substrate layer 102 to reflect and transmitted light back toward the light absorption layer. The surface preferably includes a highly reflective material, such as silver (Ag), chromium (Cr), etc. A first layer 104 is formed on or over the substrate layer 102 (or the back-reflector 114, if present) and provides a first electrode. The first layer 104 may include amorphous silicon (e.g., a-Si:H), microcrystalline silicon (μc-Si:H), SiC or other suitable materials, such as, e.g., CIGS (CuInGaS), CdTe, poly Si or other kinds of materials for thin film solar cells. Layer 104 includes N-type characteristics in this embodiment. An intrinsic layer 106 is formed on layer 104. The intrinsic layer 106 includes a compatible material with layers 104 and 108. The intrinsic layer 106 is undoped. A layer 108 is formed on the intrinsic layer 106, and has an opposite polarity relative to the layer 104 (e.g., if layer 104 is N-type then layer 108 is P-type or vice versa). In this example, layer 108 is a P-type material and layer 104 is an N-type material. Layer 108 forms a second electrode of the structure. Different combinations of material may be employed to form the photovoltaic stack, for example, CdS (n-type)/CIGS (intrinsic (i-type))/Molybdenum (p-type) on glass. Other materials may be employed as well.

The 3D structure with grooves 103 can be achieved by using various different methods including stamping, embossing, and grooving. The 3D structure may include lines, pillars, cones or other shapes. In one embodiment, spacing between pillars or lines may include a 0.5~1.0 micron spacing 105 between pillars or lines depending on the thickness of the layers 104, 106 and 108. The combined thickness of the layers 104, 106 and 108 may be between about a 0.1 and 0.5 microns. A height 107 may be 1 micron to about 5 microns. For a single junction solar cell, pillar or line shapes are preferably angular for capturing light and increasing the chance of capturing reflected light. For example, a preferred angle between a horizontal base and an edge of the pillar or line is between 90° and 60°.

Layers 104, 106 and 108 form a single junction configured to be light-absorbing of incident radiation. Note that layer 104 is in contact with or adjacent to the substrate layer 102 which may include or be configured to function as an optional back-reflector. A transparent conductive material 110 may be included to protect the structure. The transparent material 110 and layer 108 may together form an electrode of the structure 100. The transparent conductive material 110 may include a transparent conductive oxide (TCO), such as, e.g., a fluorine-doped tin oxide ($SnO_2$:F, or "FTO"), doped zinc oxide (e.g.,: ZnO:Al), and indium tin oxide (ITO) or other suitable materials. The transparent conductive material 110 permits light to pass through to an active light-absorbing material beneath (e.g., layers 104, 106, 108) and permits conduction to transport photo-generated charge carriers in that light-absorbing material.

The structure 100 is preferably a silicon thin-film cell, which includes silicon layers which may be deposited by a chemical vapor deposition (CVD) process, or a plasma-enhanced (PE-CVD)) from silane gas and hydrogen gas. Depending on the deposition parameters, amorphous silicon (a-Si or a-Si:H), and/or nanocrystalline silicon (nc-Si or nc-Si:H), also called microcrystalline silicon (μc-Si:H), may be formed.

In illustrative embodiments, structure 100 includes P-type amorphous or microcrystalline silicon (a or μc)-Si:H for layer 108 with a thickness of about 5 nm to about 20 nm. An N-type amorphous or microcrystalline silicon (a or μc)-Si:H for layer 104 includes a thickness of about 5 nm to about 20 nm. In this case, the intrinsic layer 106 includes amorphous or microcrystalline silicon (a or μc)-Si:H and may include a thickness of about 50 nm to about 300 nm preferably less than 150 nm although other dimensions may be employed.

In accordance with the present principles, substrate layer 102 includes grooves 103 or other surface features that permit increased light absorption. In one embodiment, substrate layer 102 is mechanically or chemically grooved to form trapezoidal shaped cross-sections on which layers 104, 106, 108, etc. are formed. The grooves 103 preferably include a depth of between about 1 to 5 microns and more preferably a depth of between about 1-2 microns. For high lifetime materials, the grooves 103 preferably include a depth of about 1 to about 20 microns and more preferably a depth of about 1 to about 10 microns. These dimensions are illustrative as shallower or deeper dimensions may be employed. The grooves 103 may also include rectangular, elliptical, and cylindrical shapes/cross-sections. In other embodiments, grooves 103 may be formed in two directions to form three-dimensional structures (e.g., groves into the page and in the plane of the page) or spherical islands, diamond-shaped islands, pyramidal shaped plateaus, etc. Other structures, such as grooves formed with wavy lines, are also contemplated.

Figure 2:
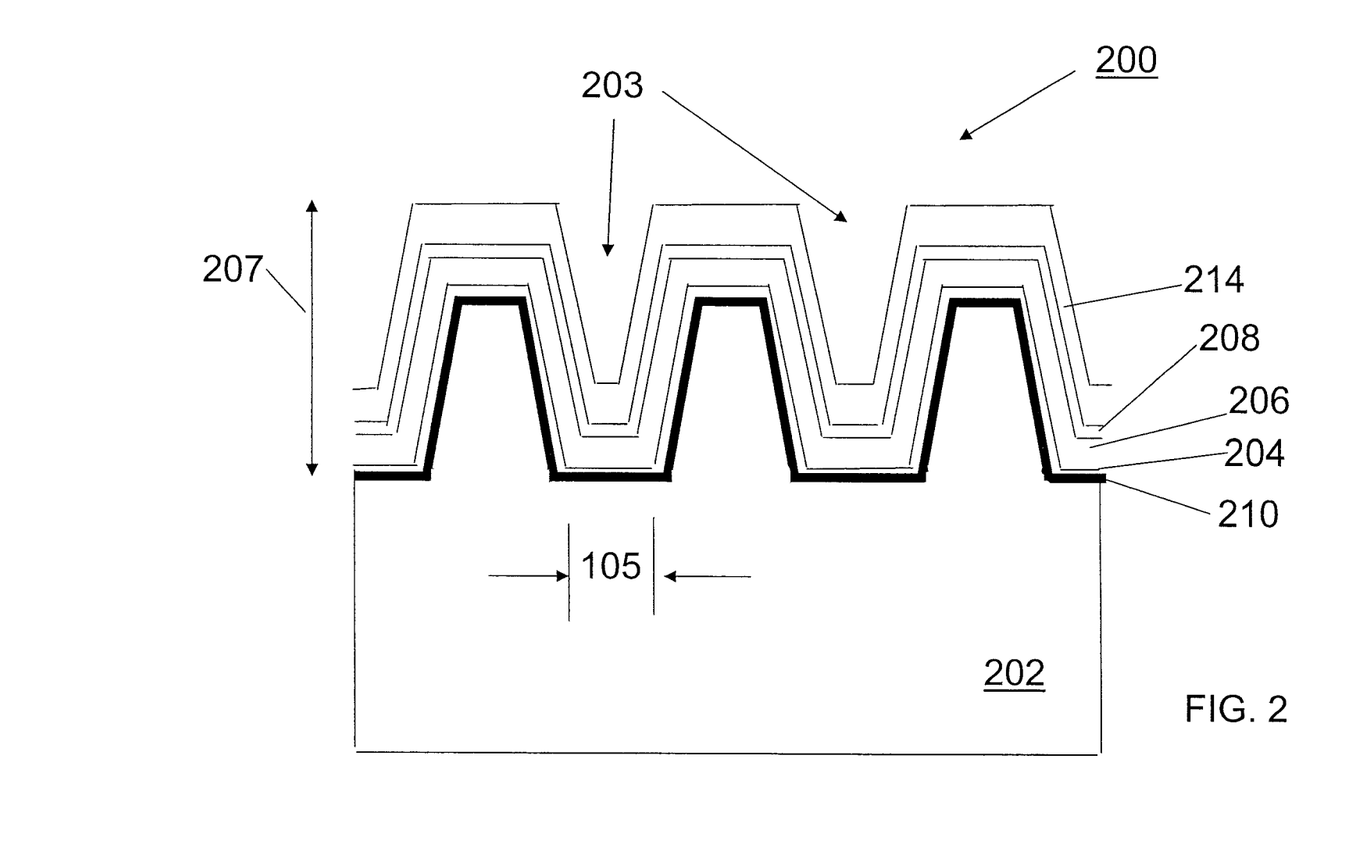
FIG. 2 is a cross-sectional view of a photovoltaic device having a plurality of grooves supporting a nanoscale junction on a transparent substrate in accordance with another embodiment.

Referring to FIG. 2, an illustrative photovoltaic structure 200 is illustratively depicted in accordance with another embodiment. The photovoltaic structure 200 may be employed in solar cells, light sensors or other photovoltaic applications. Structure 200 includes a substrate layer 202 that is prefabricated with grooves 203, which may be mechanically or chemically applied. The substrate 202 may include a transparent material, such as glass, a polymer, transparent conductive oxide (TCO), etc.

A transparent conductive material 210 may be included on substrate layer 202. The transparent conductive material 210 and adjacent layer 204 may together form an electrode of the structure 200. The transparent conductive material 110 may include a transparent conductive oxide (TCO), such as, e.g., a fluorine-doped tin oxide ($SnO_2$:F, or "FTO"), doped zinc oxide (e.g.,: ZnO:Al), and indium tin oxide (ITO) or other suitable materials.

A first layer 204 is formed on or over the substrate layer 202 (and/or transparent conductor 210, if present) and provides a first electrode. The first layer 204 may include amorphous silicon (e.g., a-Si:H), microcrystalline silicon (μc-Si:H), SiC or other suitable materials, such as, e.g., CIGS (CuInGaS), CdTe, poly Si or other kinds of materials for thin film solar cells. Layer 204 includes P-type characteristics in this embodiment. An intrinsic layer 206 is formed on layer 204. The intrinsic layer 206 includes a compatible material with layers 204 and 208. The intrinsic layer 206 is undoped. A layer 208 is formed on the intrinsic layer 206, and has an opposite polarity relative to the layer 204 (e.g., if layer 204 is P-type then layer 208 is N-type or vice versa). In this example, layer 208 is an N-type material and layer 204 is a P-type material. Layer 208 forms a second electrode of the structure. Different combinations of material may be employed to form the photovoltaic stack, for example, CdS (n-type)/CIGS(intrinsic (i-type))/Molybdenum (p-type) on glass. Other materials may be employed as well.

A back-reflector and electrode layer 214 is formed on layer 208. The back-reflector layer 214 may include a transparent oxide, such as, ZnO and a reflective surface.

The 3D structure with grooves 203 can be achieved by using various different methods including etching, embossing and grooving. The 3D structure may include lines, pillars or other shapes. In one embodiment, spacing between pillars or lines may include a 0.5~1.0 micron spacing between pillars or lines depending on the thickness of the layers 204, 206 and 208. The combined thickness of the layers 204, 206 and 208 may be between about 0.1~0.5 microns. A height 207 may be between about 1 micron and about 5 microns. For a single junction solar cell, pillar or line shapes are preferably angular for capturing light and increasing the chance of reabsorbing reflected light. For example, a preferred angle between a horizontal base and an edge of the pillar or line is between 90° and 60°.

Layers 204, 206 and 208 form a single junction configured to be light-absorbing of incident radiation. Note that layer 204 is in contact with or adjacent to the substrate layer 202 or layer 210 which may be configured to function as an optional back-reflector. The structure 200 is preferably a silicon thin-film cell, which includes silicon layers which may be deposited by a chemical vapor deposition (CVD) process, or a plasma-enhanced (PE-CVD)) from silane gas and hydrogen gas. Depending on the deposition parameters, amorphous silicon (a-Si or a-Si:H), and/or nanocrystalline silicon (nc-Si or nc-Si:H), also called microcrystalline silicon (μc-Si:H), may be formed.

In illustrative embodiments, structure 200 includes P-type amorphous or microcrystalline silicon (a or μc)-Si:H for layer 204 with a thickness of about 5 nm to about 20 nm. An N-type amorphous or microcrystalline silicon (a or μc)-Si:H for layer 208 includes a thickness of about 5 nm to about 20 nm. In this case, the intrinsic layer 206 includes amorphous or microcrystalline silicon (a or μc)-Si:H and may include a thickness of about 50 nm to about 300 nm. Other dimensions may be employed.

In accordance with the present principles, substrate layer 202 includes grooves 203 or other surface features that permit increased light absorption. In one embodiment, substrate layer 202 is mechanically or chemically grooved to faun trapezoidal shaped cross-sections on which layers 204, 206, 208, etc. are formed. The grooves 203 preferably include a depth of between about 1 to 5 microns and more preferably a depth of between about 1-2 microns. For high lifetime materials, the grooves 203 preferably include a depth of about 1 to about 20 microns and more preferably a depth of about 1 to about 10 microns. These dimensions are illustrative as shallower or deeper dimensions may be employed. The grooves 203 may also include rectangular, elliptical, and cylindrical shapes/cross-sections. In other embodiments, grooves 203 may be formed in two directions to form three-dimensional structures (e.g., groves into the page and in the plane of the page) or spherical islands, diamond-shaped islands, pyramidal shaped plateaus, etc. Other structures, such as grooves formed with wavy lines, are also contemplated.

Figure 3:
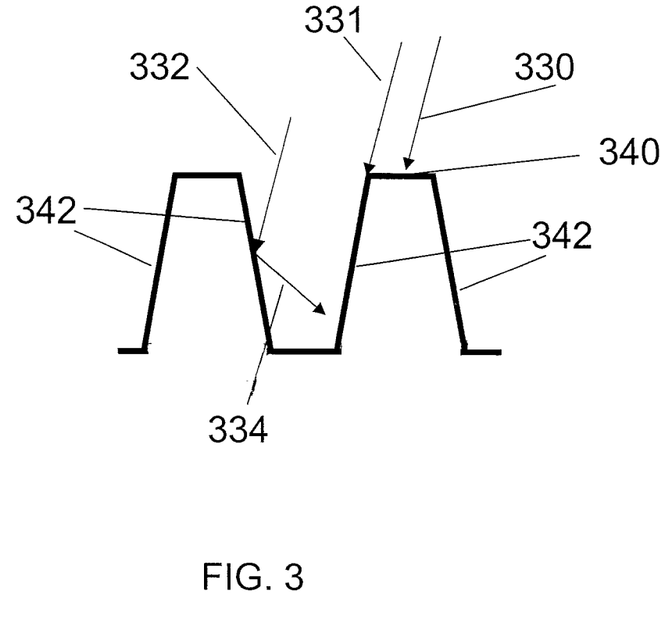
FIG. 3 is a diagram illustrative showing incident radiation falling of the structure of FIG. 1 or FIG. 2.

Referring to FIG. 3, several radiation rays 330, 331, 332 and 334 are illustratively depicted to show examples of how light absorption is increased using the structures of FIGS. 1 and 2. Ray 330 falls incident on a plateau area 340. Radiation in this area 340 is absorbed as in a planar structure. However, the areas 340 are greatly reduced. Ray 331 falls incident along a plane 342 of a light absorbing layer. As a result, the effective thickness of the light absorbing layer has a longer length. Ray 331 is therefore most likely completely absorbed. Ray 332 falls incident at an angle relative to plane 342. Part of ray 332 is reflected as a result of the geometry. A reflected ray 334 falls incident on an opposing surface of the structure, there is a multiple reflection of the ray, and the reflected ray is further absorbed. In areas outside of plateau area 340, a greater amount of radiation absorption occurs resulting in significant increases in solar cell efficiency.

In accordance with the present principles, a strong enhancement is provided for current density and voltage. Light loss is reduced in accordance with the present principles resulting in better operating efficiencies. Current density at short circuit ($J_{sc}$) is advantageously increased as a result of a single increased junction that occupies a large area of a panel and reduced light loss. In one embodiment, current density is enhanced by a factor of two or more over a planar panel design. In addition, open circuit voltage is advantageously increased.

Figure 4:
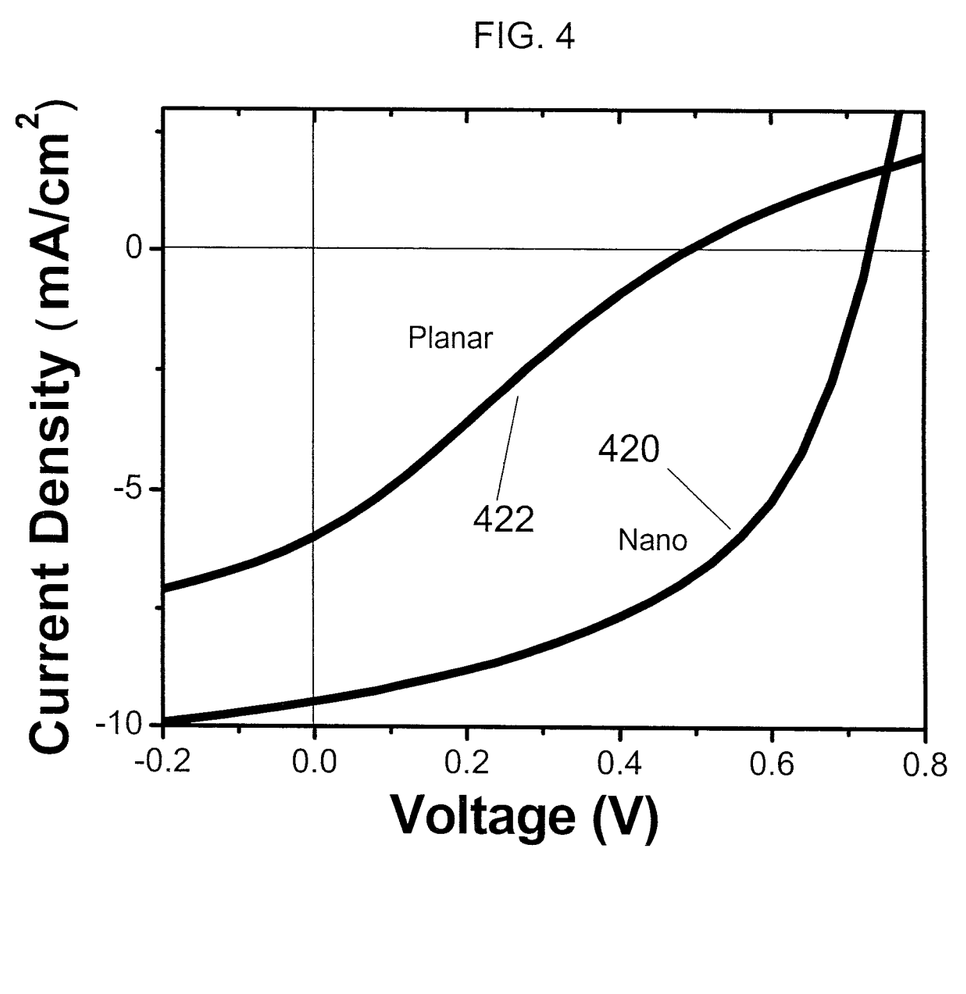
FIG. 4 is a plot of current density versus voltage for the photovoltaic device having the structure of FIG. 1 as compared to a conventional planar device.

Referring to FIG. 4, a plot of current density (mA/cm$^2$) versus voltage (V) in between a nanostructured continuous photovoltaic device (Nano) 420 in accordance with the present principles and a planar conventional device (Planar) 422 is illustratively shown. The nanostructured continuous photovoltaic device included a photovoltaic stack of less than 130 nm formed on a grooved surface (e.g., approximately 300 nm in depth). The nano device exhibited a significant increase in magnitude of current density in the desired voltage range. Note that the results provided in FIG. 4 are illustrative and should not be construed as limiting.

Figure 5:
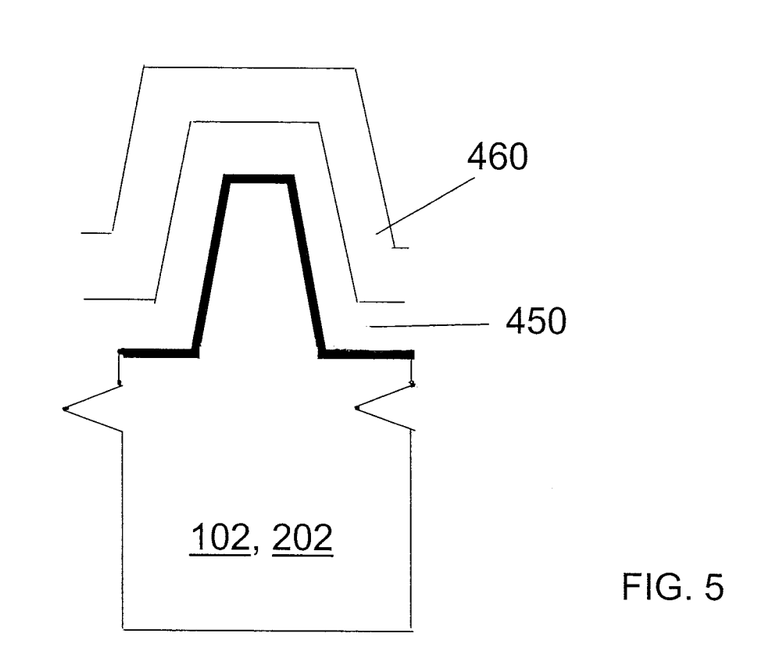
FIG. 5 is a is a cross-sectional view of the photovoltaic device of FIG. 1 or FIG. 2 having tandem nanoscale junctions by adding additional stacks in accordance with another embodiment.

Referring to FIG. 5, another embodiment shows tandem photovoltaic junction structures 450 and 460 in accordance with the present principles. An additional stack 460 (or junction) may be formed on the structure depicted in FIGS. 1 and 2. Each structure 450, 460 includes a functional combination of light absorbing layers (e.g., layers 104, 106, 108, and/or layers 204, 206 and 208). In a tandem configuration as shown, the structures preferably form about a 90 degree angle between the bottom of the grooves and the sidewalls of the structures since the sunlight or radiation can be equally absorbed by both layers 450 and 460.

Stack 460 forms a second junction stack on the junction stack 450. The stacks 450 and 460 may include, e.g., structure 100 and/or 200 depicted in FIGS. 1 and 2. It should be understood that a greater number of junction stacks may be employed. The addition of stacks increases the open circuit voltage ($V_{oc}$) of the device and assists in maximizing its value.

Figure 6:
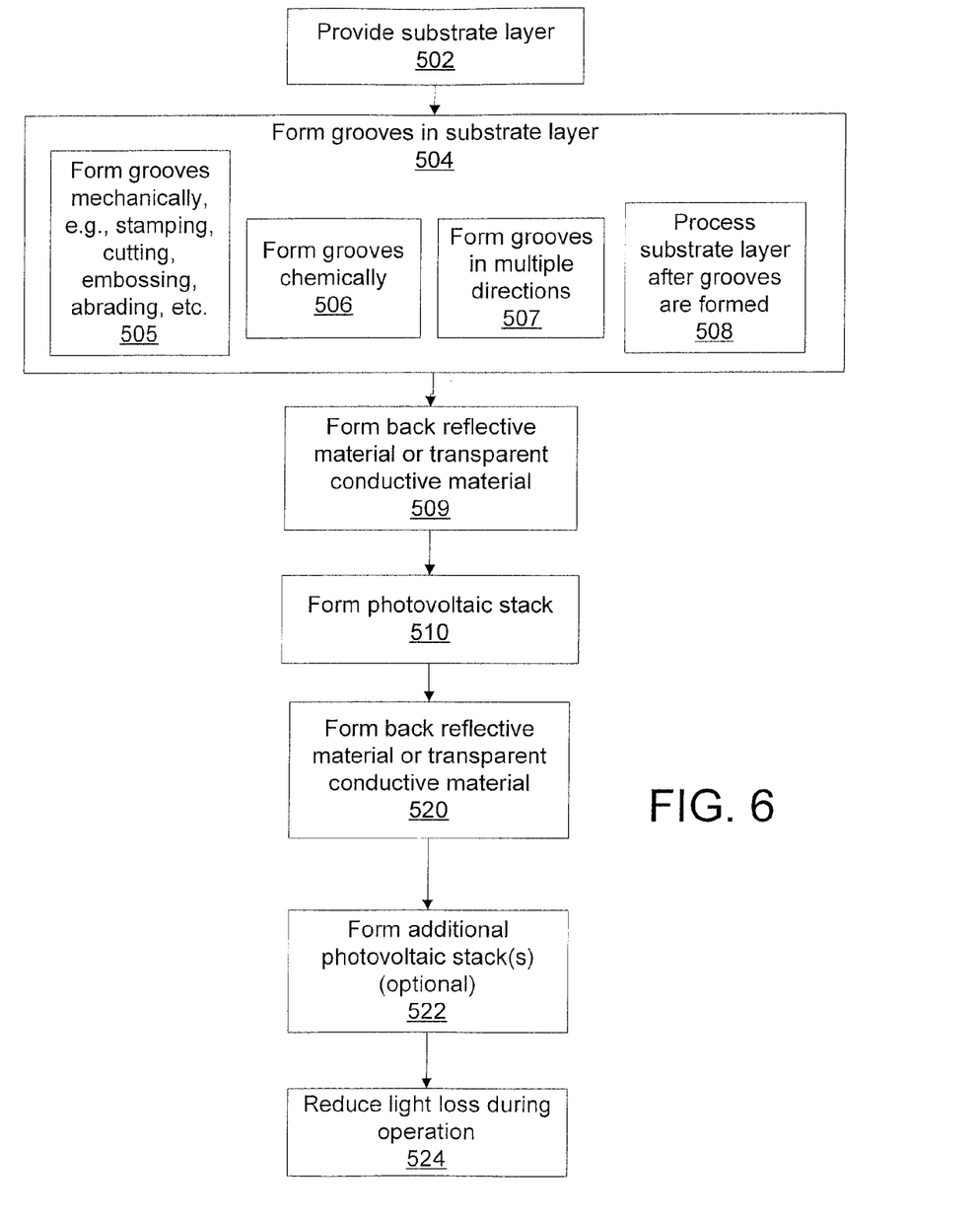
FIG. 6 is a flow diagram showing a method for fabricating a photovoltaic device in accordance with the present principles.

Referring to FIG. 6, a method for forming a photovoltaic device in accordance with one embodiment is illustratively shown. In block 502, a substrate layer is provided. In attempting to reduce cost, the present principles prefer the use of a non-semiconductor substrate layer material. For example, the substrate may include glass, a polymer, a metal, etc. In block 504, a plurality of grooves is formed in a substrate layer. The grooves preferably include a depth of less than about two microns. Larger dimensions may be employed; however, the active layers are preferably nanoscale and a depth of about a micron is preferable. In block 505, the grooves may be formed by mechanically cutting or abrading the grooves in the substrate layer. This may include micron or nanoscale cutting tools which may be raked across the surface of the substrate layer. Other methods include using 3D structuring such as embossing, stamping, molding, etc. In block 506, the grooves or portions thereof may be formed by chemically etching the grooves in the substrate layer. This may include a photolithographic masking and etching of the surface of the substrate layer. In block 507, the plurality of grooves may be formed in at least two transverse directions (e.g., to form diamond shaped islands, rectangular islands, pillars, etc.). In block 508, other processing may be performed such as etching or polishing to further shape the substrate layer.

In block 509, back reflective material or a transparent conductive material may be formed on the substrate layer before a continuous photovoltaic stack is formed. In block 510, a continuous photovoltaic stack is formed including an N-type layer, a P-type layer and an intrinsic layer therebetween. The stack conforms to a surface of the substrate layer and the plurality of grooves such that the continuous photovoltaic stack follows peaks and valleys in the substrate layer. The photovoltaic stack includes at least one of amorphous silicon, micro-crystalline silicon and silicon carbide, although other suitable materials may be employed. These materials may be properly doped using known methods. The intrinsic layer is undoped.

In block 520, back reflective material or a transparent conductive material may be formed on the continuous photovoltaic stack. In block 522, optional processing may include forming one or more additional continuous photovoltaic stacks on the continuous photovoltaic stack already formed. This increases open circuit voltage for the device and may further improve performance.

In block 524, light loss is reduced during operation by employing geometry of the plurality of grooves to absorb light laterally reflected from sides of the grooves. Light loss may be further reduced by employing multiple photovoltaic stacks.

Figure 7:
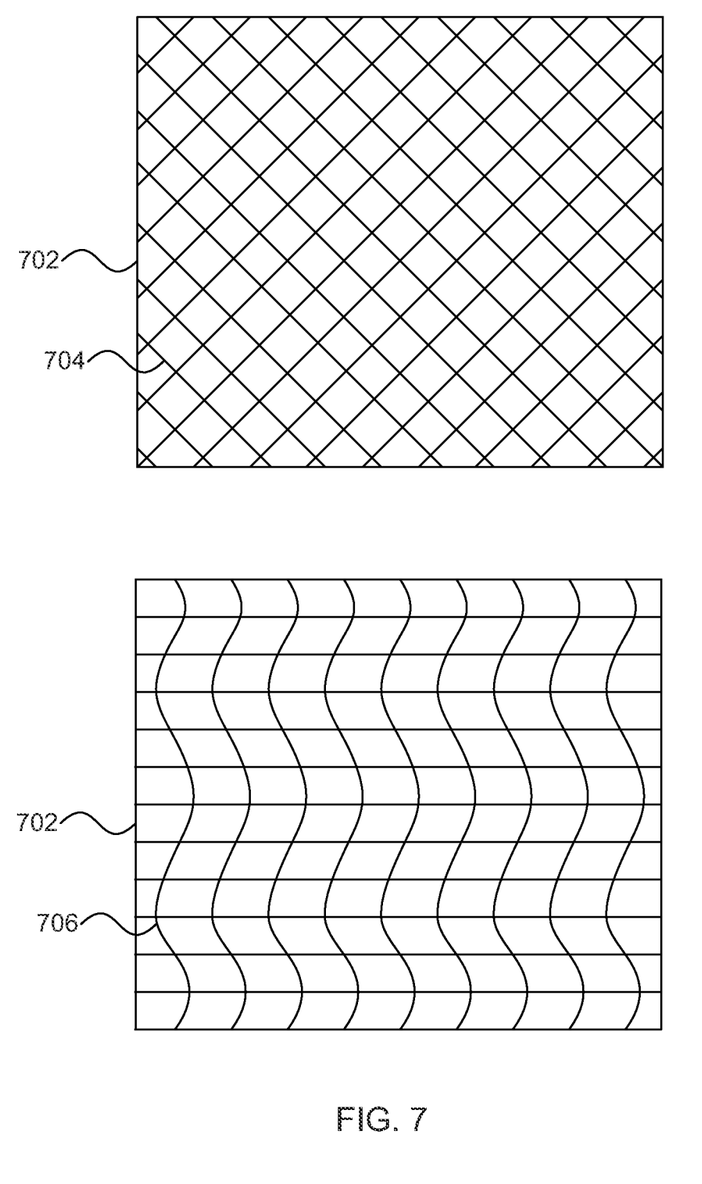
FIG. 7 is a top-down diagram of a section of a photovoltaic device illustrating regularly spaced grooves in accordance with the present principles.

Referring now to FIG. 7, two exemplary embodiments of a photovoltaic device are shown. In a first embodiment, islands 702 are formed by the intersection of regularly spaced grooves 704. The grooves depicted are straight, resulting in diamond-shaped islands. In a second embodiment, islands 702 are formed in part by the intersection of regularly spaced wavy grooves 706 with straight grooves.

Having described preferred embodiments of efficient nanoscale solar cell and fabrication method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A photovoltaic device, comprising:
   a substrate layer having a plurality of distinct regularly spaced grooves formed with peaks and troughs, wherein the plurality of distinct regularly spaced grooves extend in wavy lines in at least two transverse directions along a major surface of the substrate layer, such that the grooves form islands in the substrate surface; and
   a continuous photovoltaic stack conformally formed over the substrate layer and extending over the peaks and troughs, the photovoltaic stack having a thickness of less than one micron and configured to transduce incident radiation into current flow.

2. The device as recited in claim 1, wherein the photovoltaic stack includes at least one of amorphous silicon, micro-crystalline silicon and silicon carbide.

3. The device as recited in claim 1, wherein the grooves are formed by one of embossing, stamping and abrasion.

4. The device as recited in claim 1, wherein the grooves include angled sidewalls.

5. The device as recited in claim 1, wherein the substrate layer includes one of glass, polymer and metal.

6. The device as recited in claim 1, further comprising at least one additional continuous photovoltaic stack formed on the continuous photovoltaic stack.

7. The device as recited in claim 1, further comprising a back reflective material formed in contact with the continuous photovoltaic stack.

8. A photovoltaic device, comprising:
   a substrate layer having a plurality of distinct regularly spaced grooves formed therein across a major surface of the substrate layer, the grooves extending in wavy lines in at least two transverse directions along the major surface, such that the grooves form islands in the substrate surface; and a continuous photovoltaic stack conformally formed over the substrate layer which extends into the grooves, the photovoltaic stack including at least a P-type layer, an N-type layer and an intrinsic layer disposed therebetween, the photovoltaic stack being configured to transduce incident radiation into current flow.

9. The device as recited in claim 8, wherein the photovoltaic stack includes at least one of amorphous silicon, microcrystalline silicon and silicon carbide.

10. The device as recited in claim 8, wherein the grooves are formed by one of embossing, stamping and abrasion.

11. The device as recited in claim 8, wherein the substrate layer includes one of glass, polymer and metal.

12. The device as recited in claim 8, further comprising at least one additional continuous photovoltaic stack formed on the continuous photovoltaic stack.

13. The device as recited in claim 8, further comprising a back reflective material formed in contact with the continuous photovoltaic stack.

14. The device as recited in claim 8, wherein the grooves include angled sidewalls.

15. The device as recited in claim 8, wherein the photovoltaic stack has a depth of 0.5 microns or less.

* * * * *